(12) United States Patent
Tsuru

(10) Patent No.: US 7,863,922 B2
(45) Date of Patent: Jan. 4, 2011

(54) EVALUATION METHOD OF INSULATING FILM AND MEASUREMENT CIRCUIT THEREOF

(75) Inventor: Kiyohiro Tsuru, Chiba (JP)

(73) Assignee: Seiko Instruments Inc., Chiba (JP)

( * ) Notice: Subject to any disclaimer, the term of this patent is extended or adjusted under 35 U.S.C. 154(b) by 112 days.

(21) Appl. No.: 12/364,008

(22) Filed: Feb. 2, 2009

(65) Prior Publication Data

US 2009/0201028 A1    Aug. 13, 2009

(30) Foreign Application Priority Data

Feb. 7, 2008    (JP)    ............................... 2008-027250

(51) Int. Cl.
*G01R 31/12*    (2006.01)
(52) U.S. Cl. ....................................... 324/765; 324/555
(58) Field of Classification Search ........................ None
See application file for complete search history.

(56) References Cited

U.S. PATENT DOCUMENTS 3,599,059 A * 8/1971 Hou ............................ 257/614
5,880,494 A * 3/1999 Watanabe .................... 257/225
5,986,327 A * 11/1999 Mishio et al. ................ 257/606
6,410,952 B2 * 6/2002 Momose et al. ............. 257/288

FOREIGN PATENT DOCUMENTS

JP    6-201761 A    7/1994

* cited by examiner

*Primary Examiner*—Vinh P Nguyen
(74) *Attorney, Agent, or Firm*—Brinks Hofer Gilson & Lione

(57) ABSTRACT

Provided is a method of evaluating dielectric breakdown by applying a current to an insulating film, in which measurement for a forward direction current and measurement for a backward direction current are performed in a short period of time. For this purpose two MOS diodes in which an electrode of one MOS diode and a base of another MOS diode are short-circuited respectively are prepared to form a circuit to which the current is applied, providing current flow in one insulating film reverse to current flow in another insulating film, which enables the application of both the forward direction current and the backward direction current.

4 Claims, 5 Drawing Sheets

EVALUATION METHOD OF INSULATING FILM AND MEASUREMENT CIRCUIT THEREOF

RELATED APPLICATIONS

This application claims priority under 35 U.S.C. §119 to Japanese Patent Application No. JP2008-027250 filed on Feb. 7, 2008, the entire content of which is hereby incorporated by reference.

TECHNICAL FIELD

The present invention relates to a method of evaluating an insulating film of a semiconductor device and a measurement circuit used in the evaluation.

BACKGROUND ART

A method of measuring chronological dielectric breakdown characteristics of an insulating film, as in constant voltage time-dependent dielectric breakdown (TDDB) measurement, constant current TDDB measurement and the like, is commonly employed for evaluating an insulating film used in a semiconductor device.

The constant voltage TDDB measurement is an evaluation method that utilizes a time-dependent breakdown phenomenon in which a constant voltage not larger than the breakdown voltage is applied to the insulating film long enough to cause the dielectric breakdown of the insulating film dependent to a voltage application time. Constant current TDDB measurement is an evaluation method that utilizes a time-dependent dielectric breakdown phenomenon in which a constant amount of current is applied to the insulating film long enough to cause the dielectric breakdown of the insulating film dependent to a current application time.

FIG. 5 shows a diagram illustrating a measurement circuit for an insulating film evaluation through a constant current application. A semiconductor substrate 1 of one conductivity type includes a first diffusion layer 2 of the opposite conductivity type. An insulating film 3 and an electrode 4 are laminated on the first diffusion layer 2 to form a MOS diode. The electrode 4 of the MOS diode is connected to a terminal 5a and the diffusion layer 2 is connected to a terminal 5b. The terminal 5a and the terminal 5b are wired to a current source 8 via a switch 6a and a switch 6b, respectively, to apply current between the terminals 5a and 5b. A voltmeter 7 is connected in parallel to the current source 8. In this measurement circuit, a current is applied to the insulating film in one direction, and the direction of the current is chosen to be forward or backward to apply for the measurement of dielectric breakdown characteristics (see JP 06-201761 A, for example).

However, both the forward direction current and the backward direction current should be applied to the MOS diode in order to guarantee the endurance cycling of a semiconductor memory device. To apply both the currents in a conventional measurement circuit, the forward direction current and the backward direction current have to be applied alternately, taking a long period of time. Another problem is that, because a current is applied in both directions to the same insulating film, the evaluation result varies depending on the length of the current application time.

SUMMARY OF THE INVENTION

An object of the present invention is to provide a method of measuring the dielectric breakdown characteristics with respect to the forward and the backward direction current in one test, and predicting the lifetime for each direction.

In order to achieve the above-mentioned object, an insulating film evaluation method according to the present invention employs a measurement circuit which includes:

a first MOS diode including: a first diffusion layer formed on a semiconductor substrate of one conductivity type and having an opposite conductivity type, a first insulating film formed on the first diffusion layer, and a first electrode formed on the first insulating film;

a second MOS diode including: a second diffusion layer formed close to the first diffusion layer, a second insulating film formed on the second diffusion layer, and a second electrode formed on the second insulating film;

a first terminal connected to the first electrode and the second diffusion layer;

a second terminal connected to the second electrode and the first diffusion layer;

a current source interposed between the first terminal and the second terminal; and a voltmeter placed in parallel to the current source, and the insulating film evaluation method includes applying an electric current in one direction between the first terminal and the second terminal to measure a change in voltage between the terminals.

Further, an insulating film evaluation method employs a measurement circuit which includes:

a first MOS diode including: a first diffusion layer formed on a semiconductor substrate of one conductivity type and having an opposite conductivity type, a first insulating film formed on the first diffusion layer, and a first electrode formed on the first insulating film;

a second MOS diode including: a second diffusion layer formed close to the first diffusion layer, a second insulating film formed on the second diffusion layer, and a second electrode formed on the second insulating film;

a first terminal connected to the first electrode;

a second terminal connected to the second diffusion layer;

a third terminal connected to the second electrode;

a fourth terminal connected to the first diffusion layer;

a first contact point to which the first terminal and the second terminal are connected via a first switch and a second switch, respectively;

a second contact point to which the third terminal and the fourth terminal are connected via a third switch and a fourth switch, respectively;

a current source interposed between the first contact point and the second contact point; and a voltmeter placed in parallel to the current source, and the insulating film evaluation method includes applying an electric current in one direction between the first contact point and the second contact point to measure a change in voltage between the terminals.

Further, the insulating film evaluation method includes identifying a defective MOS diode by opening and closing the switches after the change in voltage between the terminals is detected.

Further, in the insulating film evaluation method, the first MOS diode includes a plurality of MOS diodes, and the first MOS diode includes a plurality of MOS diodes.

A dielectric breakdown test for both the positive polarity and the negative polarity can thus be performed concurrently on an insulating film under test, easily shortening the measurement time.

DETAILED DESCRIPTION OF THE PREFERRED EMBODIMENTS

Embodiments of the present invention are described below with reference to FIGS. 1 to 4.

First Embodiment

Figure 1:
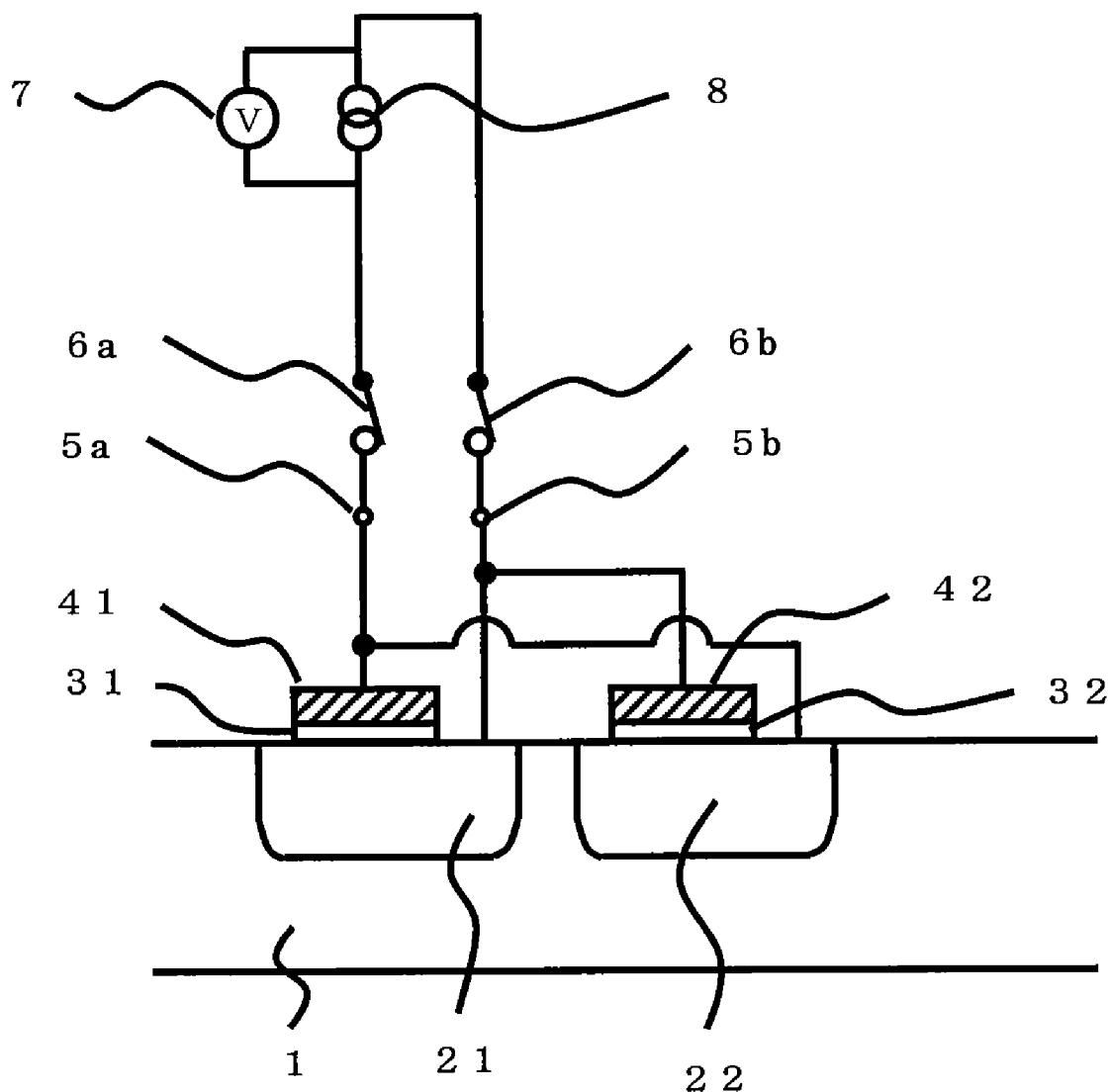
FIG. 1 is a diagram of a measurement circuit according to a first embodiment of the present invention.

As illustrated in FIG. 1, a semiconductor substrate 1 of one conductivity type includes a first diffusion layer 21 and a second diffusion layer 22 each having an opposite conductivity type. An insulating film 31 and an electrode 41 are laminated on the first diffusion layer 21 to form a first MOS diode. An insulating film 32 and an electrode 42 are laminated on the second diffusion layer 22 to form a second MOS diode. The first MOS diode and the second MOS diode are placed close to each other. The electrode 41 of the first MOS diode and the diffusion layer 22 are wired together and connected to a terminal 5a. The electrode 42 of the second MOS diode and the diffusion layer 21 are wired together and connected to a terminal 5b. The terminals 5a and 5b are wired to a current source 8 via a switch 6a and a switch 6b, respectively, and hence a current is applied between the terminals 5a and 5b. A voltmeter 7 is connected in parallel to the current source 8.

In the above-mentioned measurement system, after applying an electric current from the current source 8 in one direction by closing the switches 6a and 6b, for example, current flows from the electrode side to the diffusion layer side in the oxide film 31 and current flows from the diffusion layer side to the electrode side in the oxide film 32. The voltmeter 7 measures a change in voltage between the terminals 5a and 5b, to thereby detect the dielectric breakdown of the oxide film 31 or the oxide film 32.

While the switches 6a and 6b are put in the circuit in this embodiment, if the current source 8 has a switching function built therein, the switches 6a and 6b here can be read as this function, and putting the switches 6a and 6b in the circuit is not necessary.

Second Embodiment

Figure 2:
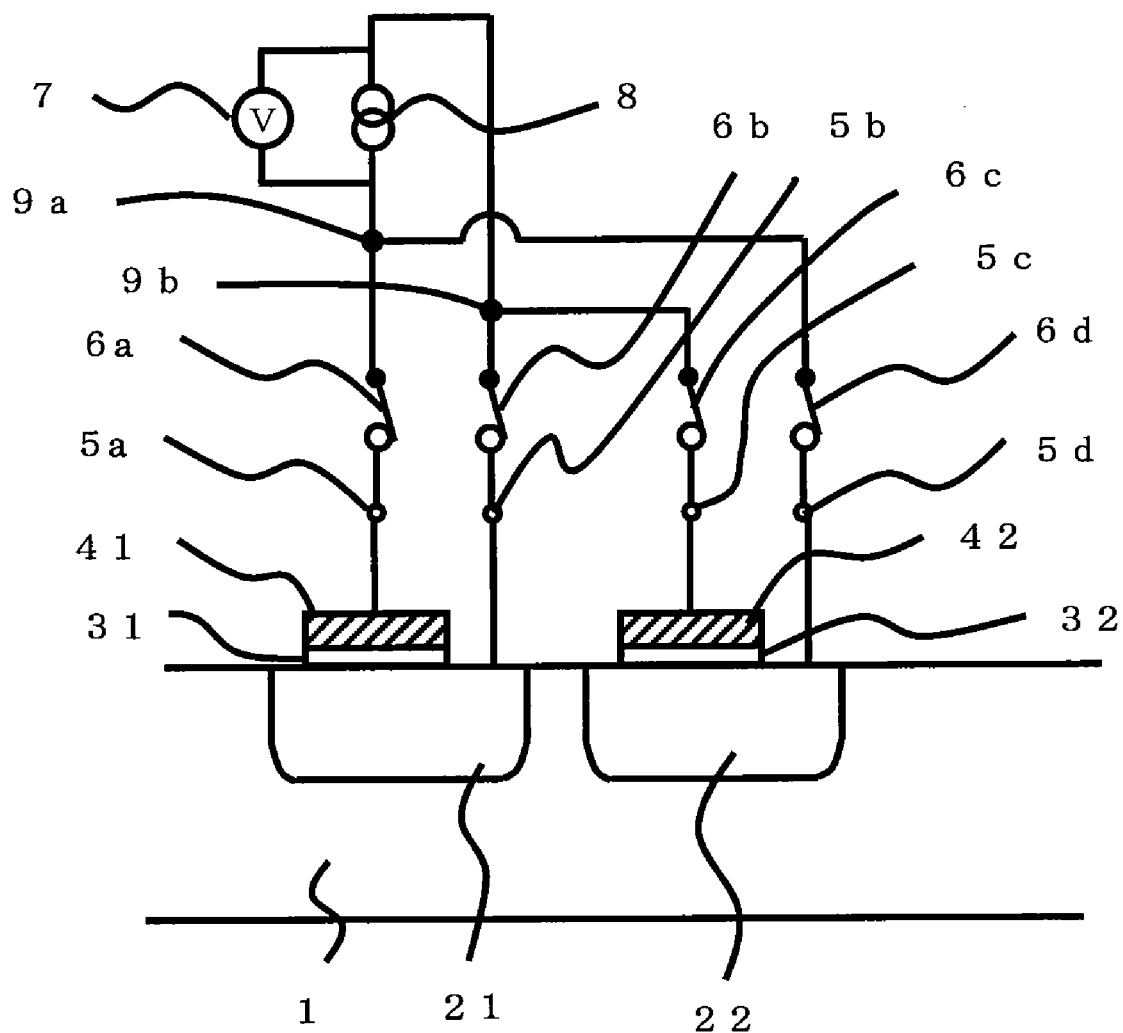
FIG. 2 is a diagram of a measurement circuit according to a second embodiment of the present invention.

As illustrated in FIG. 2, a semiconductor substrate 1 of one conductivity type includes a first diffusion layer 21 and a second diffusion layer 22, which have an opposite conductivity type. An insulating film 31 and an electrode 41 are laminated on the first diffusion layer 21 to form a first MOS diode. An insulating film 32 and an electrode 42 are laminated on the second diffusion layer 22 to form a second MOS diode. The first MOS diode and the second MOS diode are placed close to each other. A terminal 5a connected to the electrode 41 and a terminal 5d connected to the diffusion layer 22 are connected to a contact point 9a via a switch 6a and a switch 6d, respectively. A terminal 5c connected to the electrode 42 and a terminal 5b connected to the diffusion layer 21 are connected to a contact point 9b via a switch 6c and a switch 6b, respectively. A current source 8 and a voltmeter 7 are connected to the contact points 9a and 9b.

After closing the switches 6a, 6b, 6c, and 6d to apply an electric current from the current source 8 in one direction causes, for example, current flows from the electrode side to the diffusion layer side in the oxide film 31, and current flows from the diffusion layer side to the electrode side in the oxide film 32. The voltmeter 7 measures a change in voltage between the contact points 9a and 9, to thereby detect the dielectric breakdown of the oxide film 31 or the oxide film 32.

In this embodiment, when the dielectric breakdown of the oxide film 31 or the oxide film 32 is detected, a broken oxide can be identified by applying a current and measuring the voltage with closing the switches 6a and 6b and opening the switches 6c and 6d to examine a dielectric breakdown in the oxide film 31. The reverse switching operation is performed to examine a dielectric breakdown in the oxide film 32. According to the examination data dependency of the insulating film strength on the direction of the applied current can be determined between current application from the electrode side to the diffusion layer and current application from the diffusion layer to the electrode side.

Third Embodiment

The measurement circuit in the first embodiment described above has two MOS diodes paired with each other. The measurement circuit may have more MOS diodes.

Figure 3:
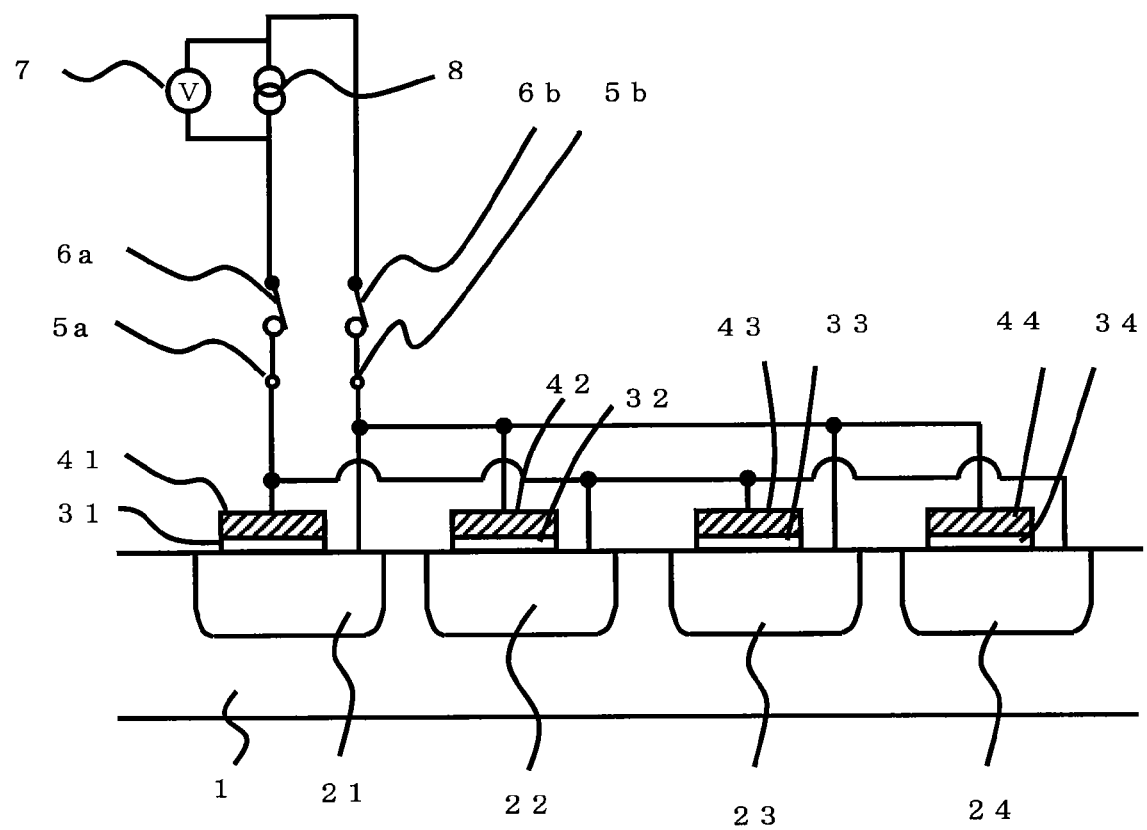
FIG. 3 is a diagram of a measurement circuit according to a third embodiment of the present invention.

FIG. 3 illustrates a measurement circuit according to a third embodiment of the present invention where a semiconductor substrate 1 of one conductivity type includes a first diffusion layer 21, a second diffusion layer 22, a third diffusion layer 23, and a fourth diffusion layer 24. The diffusion layers 21 to 24 have an opposite conductivity type. An insulating film 31 and an electrode 41 are laminated on the first diffusion layer 21 to form a first MOS diode. An insulating film 32 and an electrode 42 are laminated on the second diffusion layer 22 to form a second MOS diode. An insulating film 33 and an electrode 43 are laminated on the third diffusion layer 23 to form a third MOS diode. An insulating film 34 and an electrode 44 are laminated on the fourth diffusion layer 24 to form a fourth MOS diode. The second diffusion layer 22, the fourth diffusion layer 24, the first electrode 41, and the third electrode 43 are electrically connected to one another by a second conductive film to constitute a first terminal 5a. The first diffusion layer 21, the third diffusion layer 23, the second electrode 42, and the fourth electrode 44 are electrically connected to one another to constitute a second terminal 5b. A current source 8, a voltmeter 7, a switch 6a, and a switch 6b are connected such that a current is applied between the first terminal 5a and the second terminal 5b.

When an electric current is applied from the current source 8 in one direction, for example, current flows from the electrode side to the diffusion layer side in the oxide film 31 and the oxide film 33, and current flows from the diffusion layer side to the electrode side in the oxide film 32 and the oxide film 34. The voltmeter 7 measures a change in voltage between the terminal 1 and the terminal 2, to thereby detect the dielectric breakdown of the oxide film 31 or the oxide film 32. This embodiment describes an example in which four MOS diodes are grouped together as a set, but more MOS diodes may be combined in the circuit.

While the switches 6a and 6b are put in the circuit in this embodiment, if the current source 8 has a switching function built therein, the switches 6a and 6b here can be read as this function, and putting the switches 6a and 6b in the circuit is not necessary.

Fourth Embodiment

The measurement circuit in the second embodiment described above has two MOS diodes paired with each other. The measurement circuit may have more MOS diodes.

Figure 4:
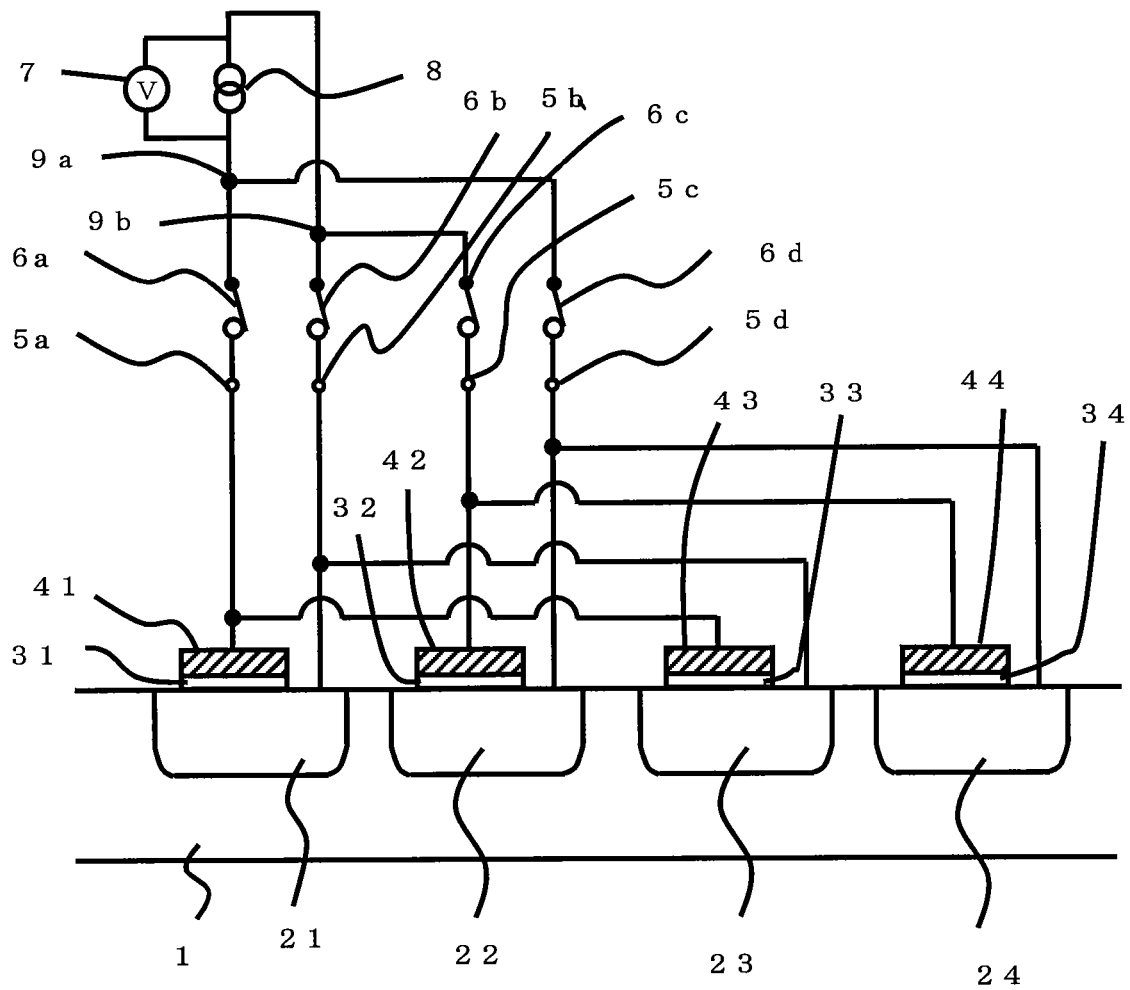
FIG. 4 is a diagram of a measurement circuit according to a fourth embodiment of the present invention.
Figure 5:
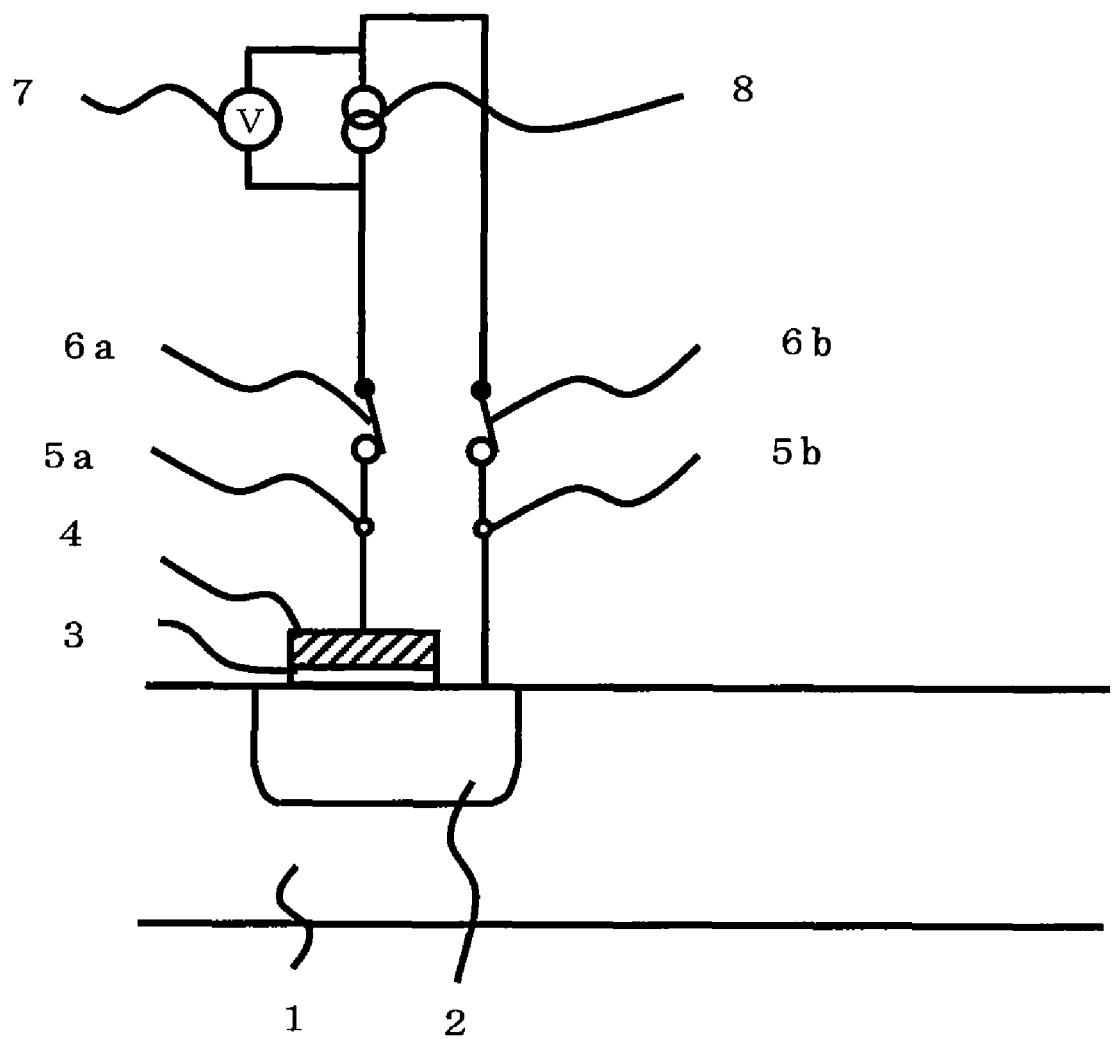
FIG. 5 is a diagram of a conventional measurement circuit for evaluating an insulating film.

FIG. 4 illustrates a measurement circuit according to a third embodiment of the present invention where a semiconductor substrate 1 of one conductivity type includes a first diffusion layer 21, a second diffusion layer 22, a third diffusion layer 23, and a fourth diffusion layer 24. The diffusion layers 21 to 24 have an opposite conductivity type. An insulating film 31 and an electrode 41 are laminated on the first diffusion layer 21 to form a first MOS diode. An insulating film 32 and an electrode 42 are laminated on the second diffusion layer 22 to form a second MOS diode. An insulating film 33 and an electrode 43 are laminated on the third diffusion layer 23 to form a third MOS diode. An insulating film 34 and an electrode 44 are laminated on the fourth diffusion layer 24 to form a fourth MOS diode. A terminal 5a is connected to the first electrode 41 and the third electrode 43. A terminal 5b is connected to the first diffusion layer 21 and the third diffusion layer 23. A terminal 5c is connected to the second electrode 21 and the fourth electrode 4. A terminal 5d is connected to the second diffusion layer 22 and the fourth diffusion layer 24. A switch 6a, which is connected to the terminal 5a, and a switch 6d, which is connected to the terminal 5d, are connected via a contact point 9a. A switch 6b, which is connected to the terminal 5b, and a switch 6c, which is connected to the terminal 5c, are connected via a contact point 9b. A voltmeter 7 and a current source 8 are connected to the contact points 9a and 9b.

When the switches 6a, 6b, 6c, and 6d are closed to apply an electric current from the current source 8 in one direction, for example, current flows from the electrode side to the diffusion layer side in the oxide film 31 and the oxide film 33, while current flows from the electrode side to the diffusion layer side in the oxide film 32 and the oxide film 34. The voltmeter 7 measures a change in voltage between the contact points 9a and 9b, to thereby detect the dielectric breakdown of the oxide film 31, the oxide film 32, the oxide film 33, or the oxide film 34.

In this embodiment, when the dielectric breakdown of the oxide film 31, the oxide film 32, the oxide film 33, or the oxide film 34 is detected, a broken oxide can be identified by applying a current and measuring the voltage with closing the switches 6a and 6b and opening the switches 6c and 6d to examine a dielectric breakdown in the oxide film 31 or the oxide film 33. Accordingly dependency of the insulating film strength on the direction of the applied current can also be determined between current application from the electrode side to the diffusion layer and current application from the diffusion layer to the electrode side.

In addition, the test may be continued to subsequently examine the MOS diode group of the oxide films that are not suffering dielectric breakdown.

This embodiment describes an example in which four MOS diodes are grouped together as a set, but more MOS diodes may be combined in the circuit.

The invention claimed is:

1. An insulating film evaluation method, employing a measurement circuit which comprises:
a first MOS diode including:
a first diffusion layer formed on a semiconductor substrate of one conductivity type and having an opposite conductivity type, a first insulating film formed on the first diffusion layer, and a first electrode formed on the first insulating film;
a second MOS diode including:
a second diffusion layer formed close to the first diffusion layer, a second insulating film formed on the second diffusion layer, and a second electrode formed on the second insulating film;
a first terminal connected to the first electrode and the second diffusion layer;
a second terminal connected to the second electrode and the first diffusion layer;
a current source interposed between the first terminal and the second terminal; and
a voltmeter placed in parallel to the current source,
the insulating film evaluation method comprising:
applying an electric current flow in one direction between the first terminal and the second terminal to measure a change in voltage between the terminals.

2. A measurement circuit for an insulating film, comprising:
a first MOS diode including: a first diffusion layer formed on a semiconductor substrate of one conductivity type and having an opposite conductivity type, a first insulating film formed on the first diffusion layer, and a first electrode formed on the first insulating film;
a second MOS diode including: a second diffusion layer formed close to the first diffusion layer, a second insulating film formed on the second diffusion layer, and a second electrode formed on the second insulating film;
a first terminal connected to the first electrode and the second diffusion layer;
a second terminal connected to the second electrode and the first diffusion layer;
a current source interposed between the first terminal and the second terminal; and
a voltmeter placed in parallel to the current source.

3. An insulating film evaluation method, employing a measurement circuit which comprises:
a first MOS diode including:
a first diffusion layer formed on a semiconductor substrate of one conductivity type and having an opposite conductivity type, a first insulating film formed on the first diffusion layer, and a first electrode formed on the first insulating film;
a second MOS diode including:
a second diffusion layer formed close to the first diffusion layer, a second insulating film formed on the second diffusion layer, and a second electrode formed on the second insulating film;
first means to electrically connect the first electrode and the second diffusion layer;
second means to electrically connect the second electrode and the first diffusion layer;
a current source interposed between the first means and the second means to apply current therebetween; and
a voltmeter placed in parallel to the current source,
the insulating film evaluation method comprising:
applying an electric current flow in one direction between the first terminal and the second terminal to measure a change in voltage between the terminals.

4. A measurement circuit for an insulating film, comprising:
a first MOS diode including:
a first diffusion layer formed on a semiconductor substrate of one conductivity type and having an opposite conductivity type, a first insulating film formed on the first diffusion layer, and a first electrode formed on the first insulating film;

a second MOS diode including:
  a second diffusion layer formed close to the first diffusion layer, a second insulating film formed on the second diffusion layer, and a second electrode formed on the second insulating film;

first means to electrically connect the first electrode and the second diffusion layer;

second means to electrically connect the second electrode and the first diffusion layer;

a current source interposed between the first means and the second means to apply current therebetween; and a voltmeter placed in parallel to the current source.

* * * * *